(12) United States Patent
Morita

(10) Patent No.: US 11,739,236 B2
(45) Date of Patent: Aug. 29, 2023

(54) RESIN COMPOSITION AND DISPLAY DEVICE INCLUDING ADHESIVE LAYER FORMED FROM THE SAME

(71) Applicant: Samsung Display Co., Ltd., Yongin-si (KR)

(72) Inventor: Keisuke Morita, Yokohama (JP)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 93 days.

(21) Appl. No.: 17/406,567

(22) Filed: Aug. 19, 2021

(65) Prior Publication Data

US 2022/0213353 A1    Jul. 7, 2022

(30) Foreign Application Priority Data

Jan. 7, 2021    (KR) .................. 10-2021-0001947

(51) Int. Cl.
| | |
|---|---|
| *C09J 7/38* | (2018.01) |
| *C09J 4/00* | (2006.01) |
| *H01L 51/52* | (2006.01) |
| *H01L 27/32* | (2006.01) |
| *H10K 50/844* | (2023.01) |
| *H10K 59/40* | (2023.01) |
| *G06F 3/041* | (2006.01) |
| *C09J 133/06* | (2006.01) |
| *C09J 133/02* | (2006.01) |
| *C09J 185/02* | (2006.01) |

(52) U.S. Cl.
CPC ............... *C09J 7/385* (2018.01); *C09J 4/00* (2013.01); *H10K 50/844* (2023.02); *H10K 59/40* (2023.02); *B32B 2307/50* (2013.01); *B32B 2307/51* (2013.01); *B32B 2457/20* (2013.01); *C09J 133/02* (2013.01); *C09J 133/062* (2013.01); *C09J 133/064* (2013.01); *C09J 185/02* (2013.01); *C09K 2323/057* (2020.08); *G06F 3/0412* (2013.01)

(58) Field of Classification Search
CPC combination set(s) only.
See application file for complete search history.

(56) References Cited

U.S. PATENT DOCUMENTS

| | | | |
|---|---|---|---|
| 8,445,103 B2 | 5/2013 | Okada et al. | |
| 2010/0112362 A1* | 5/2010 | Craciun | C09J 143/02 526/278 |
| 2017/0200915 A1* | 7/2017 | Lee | H10K 59/40 |
| 2017/0349791 A1 | 12/2017 | Lee et al. | |

FOREIGN PATENT DOCUMENTS

| | | |
|---|---|---|
| JP | 2011-63757 | 3/2011 |
| JP | 5089052 | 12/2012 |
| JP | 5527880 | 6/2014 |

(Continued)

*Primary Examiner* — Eli D. Strah
(74) *Attorney, Agent, or Firm* — KILE PARK REED & HOUTTEMAN PLLC

(57) ABSTRACT

A resin composition includes a first (meth)acrylate monomer a second (meth)acrylate monomer containing an oxy group or a divalent alkyl group, a urethane (meth)acrylate oligomer, and at least one photoinitiator. A content of the first (meth)acrylate monomer is about 1.6 to about 4.7 times greater than a content of the urethane (meth)acrylate oligomer.

20 Claims, 6 Drawing Sheets

(56) References Cited

FOREIGN PATENT DOCUMENTS

| | | | |
|---|---|---|---|
| JP | 2016-69458 | 5/2016 | |
| JP | 6633366 | 1/2020 | |
| JP | 6710822 | 6/2020 | |
| KR | 10-1203246 | 11/2012 | |
| KR | 10-2018354 | 9/2019 | |
| WO | 2016/104979 | 6/2016 | |
| WO | WO-2016109262 A1 * | 7/2016 | ............ C08F 220/18 |

* cited by examiner

RESIN COMPOSITION AND DISPLAY DEVICE INCLUDING ADHESIVE LAYER FORMED FROM THE SAME

CROSS-REFERENCE TO RELATED APPLICATION(S)

This application claims priority to and benefits of Korean Patent Application No. 10-2021-0001947 under 35 U.S.C. § 119, filed on Jan. 7, 2021 in the Korean Intellectual Property Office, the entire contents of which are incorporated herein by reference.

BACKGROUND

1. Technical Field

The disclosure herein relates to a resin composition, and a display device including an adhesive layer formed from the resin composition.

2. Description of the Related Art

Various display devices used in multimedia devices such as a television set, a mobile phone, a tablet computer, a navigation system, and a game console are being developed. Recently, display devices which are foldable, bendable, or rollable using flexible display members that are bendable are being under development to enable ease of portability and increase user friendliness.

Each member used in a flexible display device requires secure reliability in a folding or bending operation. An adhesive resin used to form an adhesive layer applied to various forms of display devices needs to have excellent coating properties on members of the various forms of display devices.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a resin composition having excellent applicability and exhibiting low elastic modulus and high adhesion characteristics after being cured.

The disclosure also provides a display device including an adhesive layer exhibiting low elastic modulus and high adhesion characteristics.

An embodiment may include a resin composition including a first (meth)acrylate monomer represented by Formula 1; a second (meth)acrylate monomer containing a substituted or unsubstituted oxy group or a substituted or unsubstituted divalent alkyl group having 4 to 18 carbon atoms; a urethane (meth)acrylate oligomer; and at least one photoinitiator, wherein a content of the first (meth)acrylate monomer may be about 1.6 to about 4.7 times greater than a content of the urethane (meth)acrylate oligomer.

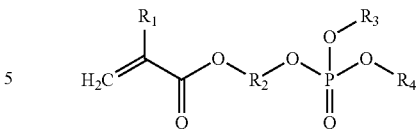

[Formula 1]

In Formula 1, $R_1$ is a hydrogen atom, or a substituted or unsubstituted alkyl group having 1 to 6 carbon atoms, $R_2$ is a substituted or unsubstituted divalent alkyl group having 1 to 10 carbon atoms, a substituted or unsubstituted divalent alkenyl group having 2 to 10 carbon atoms, a divalent alkenyl group including an ether bond and having 2 to 10 carbon atoms, or a substituted or unsubstituted alkynyl group having 2 to 10 carbon atoms, and $R_3$ and $R_4$ are each independently a substituted or unsubstituted alkyl group having 1 to 10 carbon atoms, a substituted or unsubstituted alkenyl group having 2 to 10 carbon atoms, a substituted or unsubstituted alkynyl group having 2 to 10 carbon atoms, or a substituted or unsubstituted aryl group having 6 to 20 ring-forming carbon atoms.

In an embodiment, the resin composition may have a viscosity in a range of about 5 cP to about 50 cP at about 25° C. as measured according to JIS K 7117-2 method.

In an embodiment, the content of the first (meth)acrylate monomer may be in a range in a range of about 25 wt % to about 70 wt % with respect to a total content of the resin composition.

In an embodiment, the content of the urethane (meth)acrylate oligomer may be in a range in a range of about 5 wt % to about 30 wt % with respect to a total content of the resin composition.

In an embodiment, a content of the second (meth)acrylate monomer may be in a range in a range of about 15 wt % to about 60 wt % with respect to a total content of the resin composition, and a content of the at least one photoinitiator may be in a range in a range of about 0.5 wt % to about 5 wt % with respect to the total content of the resin composition.

In an embodiment, the resin composition may have a storage elastic modulus at about −20° C. in a range in a range of about 1 to about 10 times greater than a storage elastic modulus at about 60° C. after being UV cured.

In an embodiment, the resin composition may have a storage elastic modulus in a range in a range of about $1.0 \times 10^3$ Pa to about $1.0 \times 10^6$ Pa at about 25° C. after being UV cured.

In an embodiment, the second (meth)acrylate monomer may include at least one of n-butyl (meth)acrylate, n-hexyl (meth)acrylate, n-octyl (meth)acrylate, 2-ethylhexyl acrylate, isodecyl (meth)acrylate, ethoxy diethyleneglycol acrylate, or 2-ethylhexyl-diglycol acrylate.

In an embodiment, a display device may include a display module including a display panel; a window disposed on the display panel; and an adhesive layer disposed between the display panel and the window, wherein the adhesive layer may include a polymer derived from a resin composition including a first (meth)acrylate monomer represented by Formula 1; a second (meth)acrylate monomer containing a substituted or unsubstituted oxy group or a substituted or unsubstituted divalent alkyl group having 4 to 18 carbon atoms; a urethane (meth)acrylate oligomer; and at least one photoinitiator; and a content of the first (meth)acrylate monomer may be about 1.6 to about 4.7 times greater than a content of the urethane (meth)acrylate oligomer.

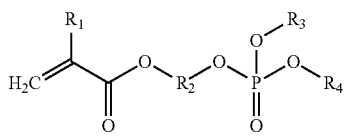

[Formula 1]

In Formula 1, $R_1$ is a hydrogen atom, or a substituted or unsubstituted alkyl group having 1 to 6 carbon atoms, $R_2$ is a substituted or unsubstituted divalent alkyl group having 1 to 10 carbon atoms, a substituted or unsubstituted divalent alkenyl group having 2 to 10 carbon atoms, a divalent alkenyl group including an ether bond and having 2 to 10 carbon atoms, or a substituted or unsubstituted alkynyl group having 2 to 10 carbon atoms, and $R_3$ and $R_4$ are each independently a substituted or unsubstituted alkyl group having 1 to 10 carbon atoms, a substituted or unsubstituted alkenyl group having 2 to 10 carbon atoms, a substituted or unsubstituted alkynyl group having 2 to 10 carbon atoms, or a substituted or unsubstituted aryl group having 6 to 20 ring-forming carbon atoms.

In an embodiment, the resin composition may directly be disposed on a surface of the window or a surface of the display module, and the adhesive layer may be formed by UV curing the resin composition.

The content of the first (meth)acrylate monomer may be in a range of about 25 wt % to about 70 wt %, and the content of the urethane (meth)acrylate oligomer may be in a range of about 5 wt % to about 30 wt % with respect to a total content of the resin composition.

A content of the second (meth)acrylate monomer may be in a range of about 15 wt % to about 60 wt %, and a content of the at least one photoinitiator may be in a range of about 0.5 wt % to about 5 wt % with respect to a total content of the resin composition.

In an embodiment, the adhesive layer may have a thickness in a range of about 10 μm to about 200 μm.

In an embodiment, the adhesive layer may have a storage elastic modulus at about −20° C. in a range of about 1 to about 10 times greater than a storage elastic modulus at about 60° C.

In an embodiment, the adhesive layer may have a storage elastic modulus in a range of about $1.0 \times 10^3$ Pa to about $1.0 \times 10^6$ Pa at about 25° C.

In an embodiment, the display device may include at least one folding area, and the at least one folding area may have a radius of curvature of about 5 mm or less.

In an embodiment, the display device may further include an input sensing unit disposed on the display panel, wherein the adhesive layer may be disposed between the display panel and the input sensing unit or disposed between the input sensing unit and the window.

In an embodiment, the display panel may include a display element layer; and an encapsulation layer disposed on the display element layer, and the input sensing unit may be directly disposed on the encapsulation layer, and the adhesive layer may be disposed on the input sensing unit.

In an embodiment, the display device may further include a light control layer disposed between the adhesive layer and the window; and an optical adhesive layer disposed between the light control layer and the window, wherein the optical adhesive layer may include a polymer derived from the resin composition.

In an embodiment, the optical adhesive layer may have a storage elastic modulus in a range of about $1.0 \times 10^3$ Pa to about $1.0 \times 10^6$ Pa at about 25° C.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
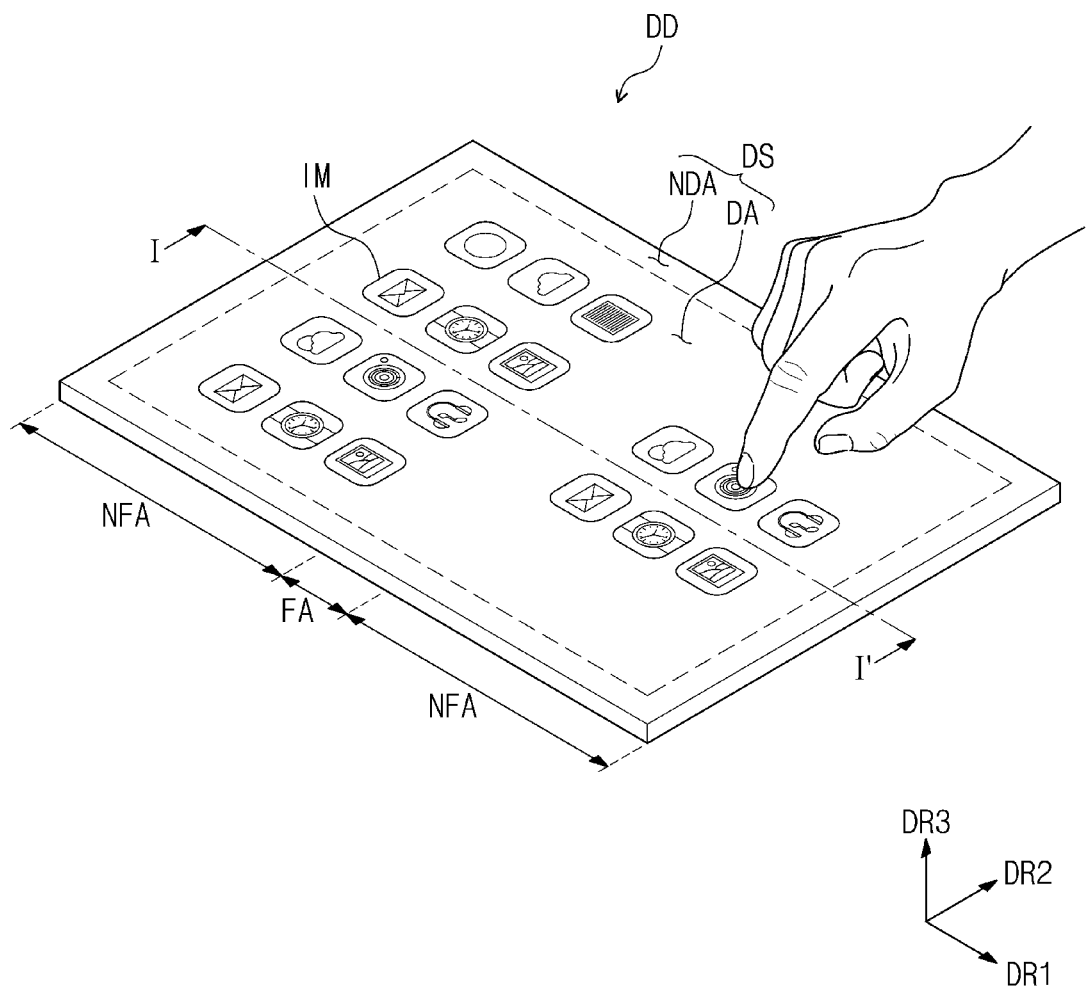
FIG. 1 is a schematic perspective view of a display device of an embodiment.

The disclosure may be modified in many alternate forms, and thus embodiments will be illustrated in the drawings and described in detail. It should be understood, however, that it is not intended to limit the disclosure to the forms disclosed, but rather, is intended to cover all modifications, equivalents, and alternatives falling within the spirit and scope of the disclosure.

In the specification, when an element (or an area, a layer, a portion, etc.) is referred to as being "on," "connected to," or "coupled to" another element, it means that the element may be directly disposed on or connected to or coupled to the other element, or that a third element or other elements may be disposed therebetween.

Like reference numerals refer to like elements throughout. Also, in the drawings, the thickness, the ratio, and the dimensions of elements are exaggerated for an effective description of technical contents.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another. For example, a first element may be referred to as a second element, and, similarly, the second element may be referred to as the first element, without departing from the scope of the disclosure. The singular forms include the plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings, but the terms are not limited thereto.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Unless otherwise defined, all terms (including technical and scientific terms) used herein have the same meaning as commonly understood by one of ordinary skill in the art to which the disclosure pertains. It is also to be understood that terms defined in commonly used dictionaries should be interpreted as having meanings consistent with the meanings in the context of the related art, and will not be interpreted in an idealized or overly formal sense unless expressly so defined herein.

It should be understood that the terms "comprises," "comprising," "includes," and/or "including,", "has," "have," and/or "having," and variations thereof specify the presence of a feature, a fixed number, a step, an operation, an element, a component, or a combination thereof disclosed in the specification, but do not exclude the possibility of presence or addition of one or more other features, fixed numbers, steps, operations, elements, components, or combination thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, a resin composition and a display device according to an embodiment of the disclosure will be described with reference to the drawings.

Figure 2:
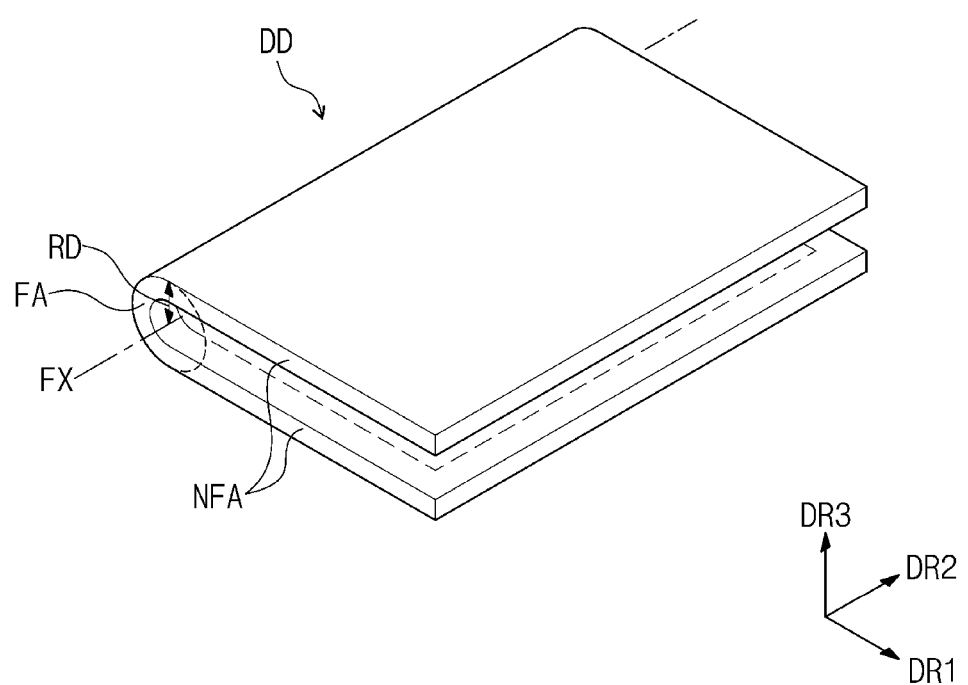
FIG. 2 is a view illustrating the display device of FIG. 1 in a folded state.

FIG. 1 is a schematic perspective view of a display device according to an embodiment of the disclosure. FIG. 2 is a view illustrating the display device shown in FIG. 1 in a folded state.

Referring to FIG. 1, a display device DD of an embodiment may have a substantially rectangular shape which has long sides extending in a first directional axis DR1 and short sides extending in a second directional axis DR2 crossing or intersecting the first directional axis DR1. However, an embodiment of the disclosure is not limited thereto, and the display device DD may have various shapes such as substantially circular and substantially polygonal shapes. The display device DD may be a flexible display device.

In the display device DD according to an embodiment, a display surface DS on which an image IM is displayed may be parallel to a plane defined by the first directional axis DR1 and the second directional axis DR2. A normal direction of the display surface DS, for example, a thickness direction of the display device DD, is indicated by a third directional axis DR3. A front surface (or a top surface) and a rear surface (or a bottom surface) in each of the members are distinguished by the third directional axis DR3. However, the directions indicated by the first to third directional axes DR1, DR2, and DR3 are relative concepts, and may thus be changed to other directions. Hereinafter, first to third directions correspond to directions indicated by the first to third directional axes DR1, DR2, DR3, respectively, and are given the same reference numerals.

The display device DD of an embodiment may include at least one folding area FA. Referring to FIGS. 1 and 2, the display device DD may include a folding area FA and non-folding areas NFA. The folding area FA may be disposed between the non-folding areas NFA, and the folding area FA and the non-folding areas NFA may be arranged or disposed adjacent to each other in the direction of the first directional axis DR1.

The folding area FA may be a portion deformable into a shape which may be folded with respect to a folding axis FX parallel to the second directional axis DR2. The folding area FA may have a radius of curvature RD of about 5 mm or less.

FIGS. 1 and 2 illustrate one folding area or a folding area FA and two non-folding areas NFA. However, the numbers of the folding area FA and the non-folding areas NFA are not limited thereto. For example, the display device DD may include three or more non-folding areas NFA and folding areas FA disposed between the non-folding areas NFA.

A display surface DS of the display device DD may include a display area DA and a non-display area NDA around the display area DA. The display area DA may display images, and the non-display area NDA may not display images. The non-display area NDA may surround or may be adjacent to the display area DA, and may define an edge of the display device DD.

Referring to FIG. 2, the display device DD may be a foldable display device DD which is folded or unfolded. For example, the folding area FA may be bent along the folding axis FX parallel to the second directional axis DR2, and the display device DD may be folded. The folding axis FX may be defined as a minor axis parallel to the short sides of the display device DD. However, an embodiment of the disclosure is not limited thereto, and the folding axis may be a major axis parallel to the long sides of the display device DD. Unlike the feature illustrated in FIG. 2, the folding axis may be parallel to the first directional axis DR1.

In case that the display device DD is folded, the non-folding areas NFA may face each other, and the display device DD may be in-folded such that the display surface DS is not exposed to the outside. However, an embodiment of the disclosure is not limited thereto, and the display device DD may be out-folded such that the display surface DS is exposed to the outside.

Figure 3:
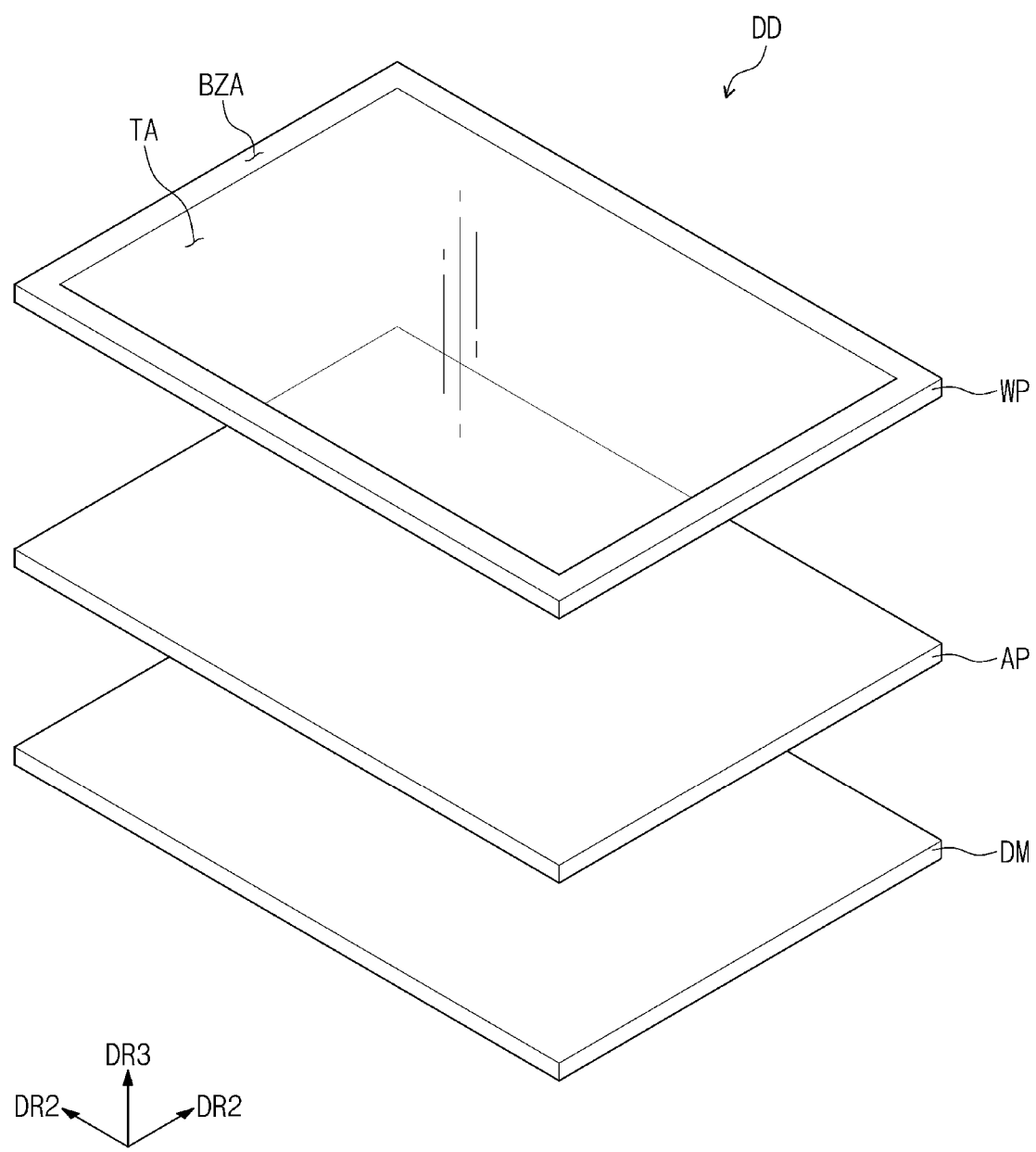
FIG. 3 is an exploded schematic perspective view of a display device according to an embodiment of the disclosure.
Figure 4:
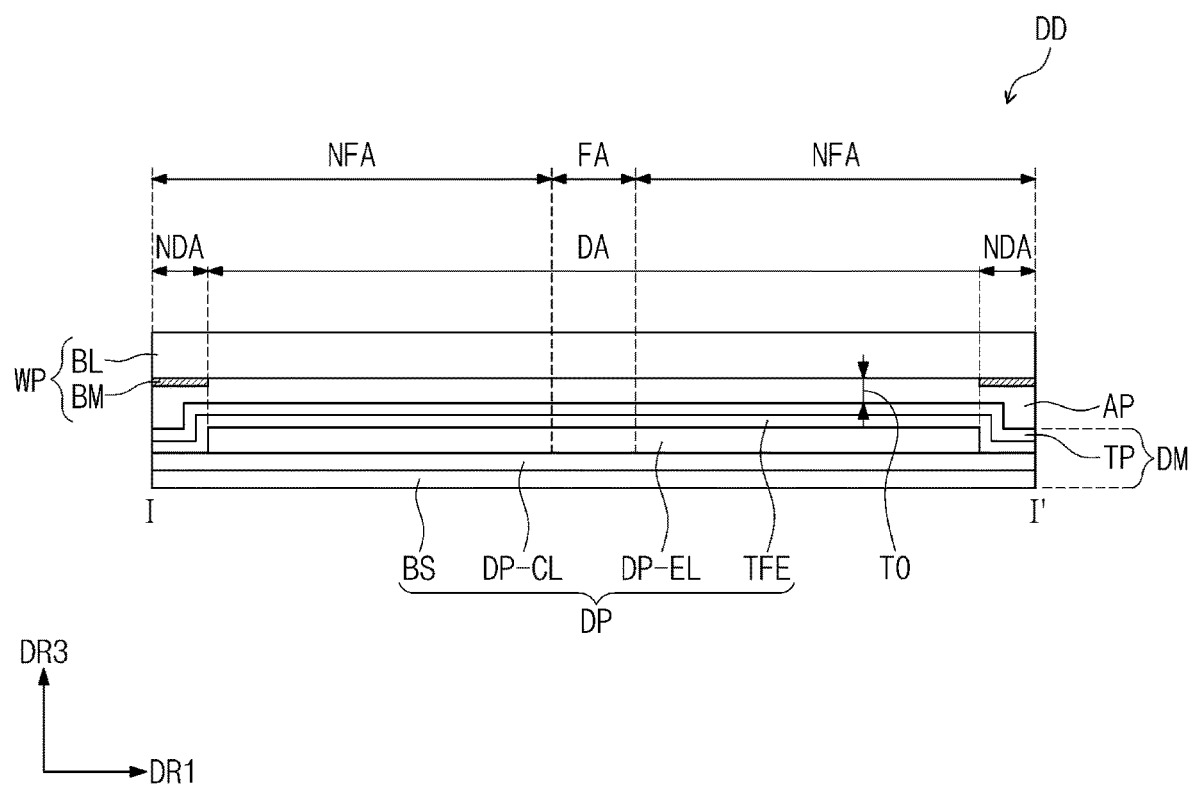
FIG. 4 is a schematic cross-sectional view of a display device of an embodiment.

FIG. 3 is an exploded schematic perspective view of a display device DD according to an embodiment of the disclosure. FIG. 4 is a view corresponding to line I-I' of FIG. 1, and a schematic cross-sectional view of a display device DD according to an embodiment of the disclosure.

The display device DD of an embodiment may include a display module DM and a window WP disposed on the display module DM. In the display device DD of an embodiment, the display module DM may include a display panel DP including a display element layer DP-EL, and an input sensing unit TP disposed on the display panel DP. The display device DD of an embodiment may include an adhesive layer AP disposed between the display panel DP and the window WP. For example, the adhesive layer AP may be disposed between the input sensing unit TP and the window WP. The adhesive layer AP may be disposed on the input sensing unit TP. The adhesive layer AP may be an optically clear adhesive resin layer (OCR).

The adhesive layer AP may include a polymer derived from the resin composition of an embodiment. The resin composition of an embodiment may include a first (meth) acrylate monomer, a second (meth)acrylate monomer, a urethane (meth)acrylate oligomer, and at least one photoinitiator.

The first (meth)acrylate monomer may be represented by Formula 1 below. The first (meth)acrylate monomer may include a phosphate ester group.

[Formula 1]

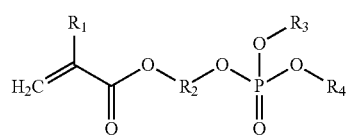

In Formula 1, $R_1$ may be a hydrogen atom, or a substituted or unsubstituted alkyl group having 1 to 6 carbon atoms. $R_2$ may be a substituted or unsubstituted divalent alkyl group having 1 to 10 carbon atoms, or a substituted or unsubstituted divalent alkenyl group having 2 to 10 carbon atoms. A divalent alkenyl group having 2 to 10 carbon atoms may include an ether bond. For example, $R_1$ may be a hydrogen atom or an unsubstituted alkyl group having 1 to 6 carbon atoms. $R_2$ may be an unsubstituted divalent alkyl group having 1 to 10 carbon atoms, or an unsubstituted divalent alkenyl group having 2 to 10 carbon atoms.

$R_3$ and $R_4$ may be each independently a substituted or unsubstituted alkyl group having 1 to 10 carbon atoms, a substituted or unsubstituted alkenyl group having 2 to 10 carbon atoms, or a substituted or unsubstituted aryl group having 6 to 20 ring-forming carbon atoms. For example, $R_3$ and $R_4$ may be each independently an unsubstituted alkyl group having 1 to 10 carbon atoms, an unsubstituted alkenyl group having 2 to 10 carbon atoms, or an unsubstituted aryl group having 6 to 20 ring-forming carbon atoms.

In the specification, the term "substituted or unsubstituted" may indicate that one is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, an alkyl group, an alkenyl group, an alkynyl group, an alkoxy group, a hydrocarbon ring group, an aryl group, and a heterocyclic group. Each of the substituents described above may be substituted or unsubstituted. For example, a biphenyl group may be interpreted as an aryl group or a phenyl group substituted with a phenyl group.

In the specification, the alkyl group may be a linear, branched or cyclic type. The number of carbons in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, for example, but an embodiment of the disclosure is not limited thereto.

In the specification, the alkenyl group may be linear or branched. The alkenyl group may include at least one double bond. The number of carbon atoms in the alkenyl group is not specifically limited, but is 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, for example, but an embodiment of the disclosure is not limited thereto.

In the specification, the alkynyl group may be linear or branched. The alkynyl group may include at least one triple bond. The number of carbon atoms in the alkynyl group is not specifically limited, but is 2 to 30, 2 to 20, or 2 to 10. Examples of the alkynyl group may include an ethynyl group, a propynyl group, a 1-butynyl group, for example, but an embodiment of the disclosure is not limited thereto.

In the specification, the above description with respect to the alkyl group may be applied to a divalent alkyl group except that the divalent alkyl group is a divalent group. The above description of the alkenyl group may be applied to a divalent alkenyl group, except that the divalent alkenyl group is a divalent group. The above description with respect to the alkynyl group may be applied to a divalent alkynyl group except that the divalent alkynyl group is a divalent group.

The hydrocarbon ring group herein means any functional group or substituent derived from an aliphatic hydrocarbon ring. The hydrocarbon ring group may be a saturated hydrocarbon ring group having 5 to 20 ring-forming carbon atoms.

The aryl group herein means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, for example, but an embodiment of the disclosure is not limited thereto.

The oxy group herein may mean that an oxygen atom is bonded to the alkyl group or the aryl group as defined above. The oxy group may include an alkoxy group and an aryl oxy group. The alkoxy group may be a linear chain, a branched chain or a ring chain. The number of carbon atoms in the alkoxy group may be 1 to 20 or 1 to 10. Examples of the oxy group include methoxy, ethoxy, n-propoxy, isopropoxy, butoxy, pentyloxy, hexyloxy, octyloxy, nonyloxy, decyloxy, benzyloxy, for example, but an embodiment of the disclosure is not limited thereto.

In the resin composition of an embodiment, the first (meth)acrylate monomer and the second (meth)acrylate monomer may include at least one acryloyl group or at least one methacryloyl group per monomer unit. The first (meth) acrylate monomer and the second (meth)acrylate monomer may include at least one (meth)acryloyl group. In the specification, the (meth)acryloyl group represents an acryloyl group or a methacryloyl group, and (meth)acrylic represents acrylic or methacrylic. For example, the first (meth)acrylate monomer and the second (meth)acrylate monomer may be an acrylate monomer or a methacrylate monomer containing one acryloyl group or one methacryloyl group.

The first (meth)acrylate monomer and the second (meth) acrylate monomer may each independently include different monomers. For example, in the resin composition of an embodiment, the second (meth)acrylate monomer may contain at least one acrylate monomer and at least one methacrylate monomer.

In the resin composition of an embodiment, the second (meth)acrylate monomer may include a substituted or unsubstituted oxy group, or a substituted or unsubstituted divalent alkyl group having 4 to 18 carbon atoms. For example, the second (meth)acrylate monomer may include at least one of n-butyl (meth)acrylate, n-hexyl(meth)acrylate, n-octyl(meth)acrylate, 2-ethylhexyl acrylate, isodecyl (meth)acrylate, ethoxy diethyleneglycol acrylate, or 2-ethylhexyl-diglycol acrylate.

The second (meth)acrylate monomer may include at least one of alicyclic (meth)acrylate or alkyl (meth)acrylate. For example, examples of the alkyl (meth)acrylate may include methyl (meth)acrylate, lauryl (meth)acrylate, stearyl (meth) acrylate, isostearyl (meth)acrylate, for example, within the spirit and the scope of the disclosure. Examples of the alicyclic (meth)acrylate may include dicyclopentenyloxyethyl (meth)acrylate, norbornene (meth)acrylate, dicyclopentenyl (meth)acrylate, isobornyl (meth)acrylate, 2-methyl-2-ethyl-1,3-dioxolan-4-yl)-methyl acrylate, for example, within the spirit and the scope of the disclosure. The urethane (meth)acrylate oligomer may include at least one (meth)acryloyl group having a urethane bond. The urethane acrylate oligomer may include at least one of an acrylate having a urethane bond, a urethane acrylate having a polyester skeleton, a urethane acrylate having a polycarbonate skeleton, or a urethane acrylate having a polyether skeleton.

According to an embodiment, the content of the first (meth)acrylate monomer may be about 1.6 to about 4.7 times greater than the content of the urethane (meth)acrylate oligomer. The content of the first (meth)acrylate monomer may be in a range of about 25 wt % to about 70 wt % with respect to a total content of the resin composition. The content of the urethane (meth)acrylate oligomer may be in a range of about 5 wt % to about 30 wt % with respect to a total content of the resin composition. The content of the urethane (meth)acrylate oligomer may be in a range of about 10 wt % to about 20 wt % with respect to a total content of the resin composition. For example, the content of the urethane (meth)acrylate oligomer may be about 15 wt %, and the content of the first (meth)acrylate monomer may be about 25 wt %, about 50 wt %, about 55 wt %, about 65 wt %, or about 70 wt % with respect to a total content of the resin composition. With respect to a total content of the resin composition, the content of the urethane (meth)acrylate oligomer may be about 15 wt %, and the content of the first (meth)acrylate monomer may be about 25 wt % that may be about 1.7 times greater than the content of the urethane (meth)acrylate oligomer. With respect to a total content of the resin composition, the content of the urethane (meth) acrylate oligomer may be about 15 wt %, and the content of the first (meth)acrylate monomer may be about 70 wt % that may be about 4.7 times greater than the content of the urethane (meth)acrylate oligomer. However, these are only illustrations, the content of the first (meth)acrylate monomer and the content of the urethane (meth)acrylate oligomer are not limited thereto.

The content of the second (meth)acrylate monomer may be in a range of about 15 wt % to about 60 wt % with respect to a total content of the resin composition. Also, the content of the photoinitiator may be in a range of about 0.5 wt % to about 5 wt % with respect to a total content of the resin composition. The content of the photoinitiator may be in a range of about 1 wt % to about 3 wt % with respect to a total content of the resin composition. For example, the content of the second (meth)acrylate monomer may be about 15 wt %, about 20 wt %, about 30 wt %, about 35 wt %, or about 60 wt % with respect to a total content of the resin composition. The content of the photoinitiator may be about 2 wt % with respect to a total content of the resin composition. However, these are only illustrations, the content of the second (meth) acrylate monomer and the content of the photoinitiator are not limited thereto.

The resin composition of an embodiment may include at least one photoinitiator. In case that the resin composition may include photoinitiators, different photoinitiators may be activated by ultraviolet rays having different center wavelengths.

For example, the photoinitiator may be any one among 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, and 2-hydroxy-1-{4-[4-(2-hydroxy-2-methyl-propionyl)-benzyl]-phenyl}-2-methylpropan-1-one.

The photoinitiator may be any one among 2-methyl-1-[4-(methylthio)phenyl]-2-morpholinopropan-1-one, 2-benzyl-2-dimethylamino-1-(4-morpholinophenyl)-butanone-1,2-dimethylamino-2-(4-methyl-benzyl)-1-(4-morpholin-4-yl-phenyl)-butan-1-one, 2,4,6-trimethylbenzoyl-diphenylphosphine oxide, 2,4,6-trimethylbenzoyl-diphenyl phosphinate, bis(2,4,6-trimethylbenzoyl)-phenylphosphineoxide, [1-(4-phenylsulfanylbenzoyl)heptylideneamino] benzoate, [1-[9-ethyl-6-(2-methylbenzoyl)carbazol-3-yl] ethylideneamino] acetate, and bis(2,4-cyclopentadienyl)bis [2,6-difluoro-3-(1-pyrryl)phenyl] titanium(IV).

The resin composition of an embodiment may be provided by a method such as an inkjet printing method or a dispensing coating method. The resin composition including the urethane (meth)acrylate oligomer and the first (meth) acrylate monomer containing a phosphate ester group may exhibit a low viscosity characteristic. The resin composition may have a viscosity in a range of about 5 cP to about 50 cP at about 25° C. In an embodiment, the resin composition exhibiting a viscosity in a range of about 5 cP to about 50 cP may be provided by a method such as an inkjet printing method or a dispensing coating method. The viscosity at about 25° C. is measured according to JIS K 7117-2 method. For example, the viscosity at about 25° C. of the resin composition may be in a range of about 20 cP to about 45 cP.

In case that the resin composition having a viscosity of less than 5 cP is used to form an adhesive layer, a flow of the resin composition may be generated. In case that the flow of the resin composition is generated, it may be difficult to form an adhesive layer having a uniform thickness. In case that the resin composition having a viscosity of greater than 50 cP is used to form an adhesive layer, it may be difficult to discharge the resin composition from an apparatus used in case that forming the adhesive layer.

A liquid resin composition may be cured by UV irradiation. After being UV cured, the resin composition may have a storage elastic modulus at about −20° C. in a range of about 1 to about 10 times greater than a storage elastic modulus at about 60° C. After being UV cured, the resin composition may have a storage elastic modulus in a range of about $1.0×10^3$ Pa to about $1.0×10^6$ Pa at about 25° C. For example, after being UV cured, the resin composition may have a storage elastic modulus in a range of about $1.5×10^5$ Pa to about $8.5×10^5$ Pa at about 25° C.

The resin composition of an embodiment may include a first (meth)acrylate monomer, a urethane (meth)acrylate oligomer, a second (meth)acrylate monomer, and a photoinitiator. The first (meth)acrylate monomer may include a phosphate ester group. Accordingly, the resin composition may exhibit a viscosity in a range of about 5 cP to about 50 cP, and may exhibit a storage elastic modulus in a range of $1.0×10^3$ Pa to $1.0×10^6$ Pa at about 25° C. after photo-curing.

Referring to FIG. 4, the display panel DP may include a base substrate BS, a circuit layer DP-CL disposed on the base substrate BS, a display element layer DP-EL disposed on the circuit layer DP-CL, and an encapsulation layer TFE which covers or overlaps the display element layer DP-EL. For example, the display panel DP may include organic light emitting elements or quantum dot light emitting elements in the display element layer DP-EL. The display panel DP may include a liquid crystal display element, and in case that the display panel DP may include the liquid crystal display element, the encapsulation layer TFE may be omitted.

The input sensing unit TP may be disposed on the display panel DP. For example, the input sensing unit TP may be disposed on or directly disposed on the encapsulation layer TFE of the display panel DP. The input sensing unit TP may detect an external input, convert the external input to an input signal, and provide the input signal for the display panel DP. The display panel DP may receive the input signal from the input sensing unit TP, and generate an image corresponding to the input signal. For example, in the display device DD of an embodiment, the input sensing unit TP may be a touch sensing unit that senses a touch. The input sensing unit TP may recognize a user's direct touch, a user's indirect touch, a direct touch of an object, or an indirect touch of an object.

The window WP may protect the display panel DP, the input sensing unit TP, and the like within the spirit and the scope of the disclosure. The image IM generated in the display panel DP may be provided to a user by being transmitted through the window WP. The window WP may provide a touch surface of the display device DD. In the display device DD including the folding area FA, the window WP may be a flexible window.

The window WP may include a transmission area TA and a bezel area BZA. The front surface of the window WP including the transmission area TA and the bezel area BZA corresponds to the front surface of the display device DD. The transmission area TA may be an optically transparent area. The bezel area BZA may have a relatively lower light transmittance than the transmission area TA. The bezel area BZA may have a color. The bezel area BZA may be adjacent to the transmission area TA, and may surround or may be adjacent to the transmission area TA. The bezel area BZA may define or substantially define the shape of the transmission area TA. However, an embodiment of the disclosure is not limited to the one illustrated, the bezel area BZA may be disposed adjacent to only one side or a side of the transmission area TA, and a portion thereof may be omitted.

The window WP may include a base layer BL and a printing layer BM. The base layer BL may be a glass or plastic substrate. For example, a tempered glass substrate may be used in the base layer BL. As an example, the base layer BL may be formed of a flexible polymer resin. For example, the base layer BL may be formed of polyimide, polyacrylate, polymethylmethacrylate, polycarbonate, polyethylenenaphthalate, polyvinylidene chloride, polyvinylidene difluoride, polystyrene, ethylene-vinyl alcohol copolymer, or a combination thereof. However, an embodiment of the disclosure is not limited thereto, and a general form as the base layer BL of the window WP in the art may be used without limitation.

The printing layer BM may be disposed on one surface or a surface of the base layer BL. In an embodiment, the printing layer BM may be provided on the bottom surface of the base layer BL adjacent to the display module DM. The printing layer BM may be disposed on an edge area of the base layer BL. The printing layer BM may be an ink printing layer. The printing layer BM may be a layer including a pigment or a dye. In the window WP, the bezel area BZA may be a portion in which the printing layer BM is provided.

The window WP may further include at least one functional layer (not shown) provided on the base layer BL. For example, the functional layer (not shown) may be a hard coating layer, an anti-fingerprint coating layer, for example, but an embodiment of the disclosure is not limited thereto.

There may be a stepped portion between the portion in which the printing layer BM is provided and the base layer BL in which the printing layer BM is not provided. The adhesive layer AP of an embodiment, which is formed from the resin composition, exhibits good storage elastic modulus and adhesion, and thus may be adhered to the window WP at the stepped portion without a gap.

According to an embodiment, the adhesive layer AP may be disposed between the input sensing unit TP and the window WP. The thickness TO of the adhesive layer AP may be in a range of about 10 μm to about 200 μm. The adhesive layer having a thickness of less than about 10 μm may have reduced adhesion to members of the window, the display panel, for example, within the spirit and the scope of the disclosure. Also, the adhesive layer having a thickness of greater than about 200 μm may not allow easy folding and unfolding.

The adhesive layer AP may include a polymer derived from a resin composition including a first (meth)acrylate monomer containing a phosphate ester group, a second (meth)acrylate monomer containing an oxy group or an alkenyl group, a urethane (meth)acrylate oligomer, and at least one photoinitiator. The adhesive layer AP including the polymer derived from the resin composition of an embodiment may have a storage elastic modulus at about −20° C. about 1 to about 10 times greater than a storage elastic modulus at about 60° C. The adhesive layer AP of an embodiment may have a storage elastic modulus in a range of about $1.0\times10^3$ Pa to about $1.0\times10^6$ Pa at about 25° C. Accordingly, in case that the display device DD is repeatedly folded and unfolded, the adhesive layer AP may not be peeled off, and the reliability of the display device DD may be maintained.

According to an embodiment, the adhesive layer AP may be formed by UV curing a liquid resin composition. The adhesive layer AP may be formed by providing or directly providing a resin composition on one surface or a surface of the window WP or on one surface or a surface of the display module DM, and curing the provided resin composition.

Figure 5A:
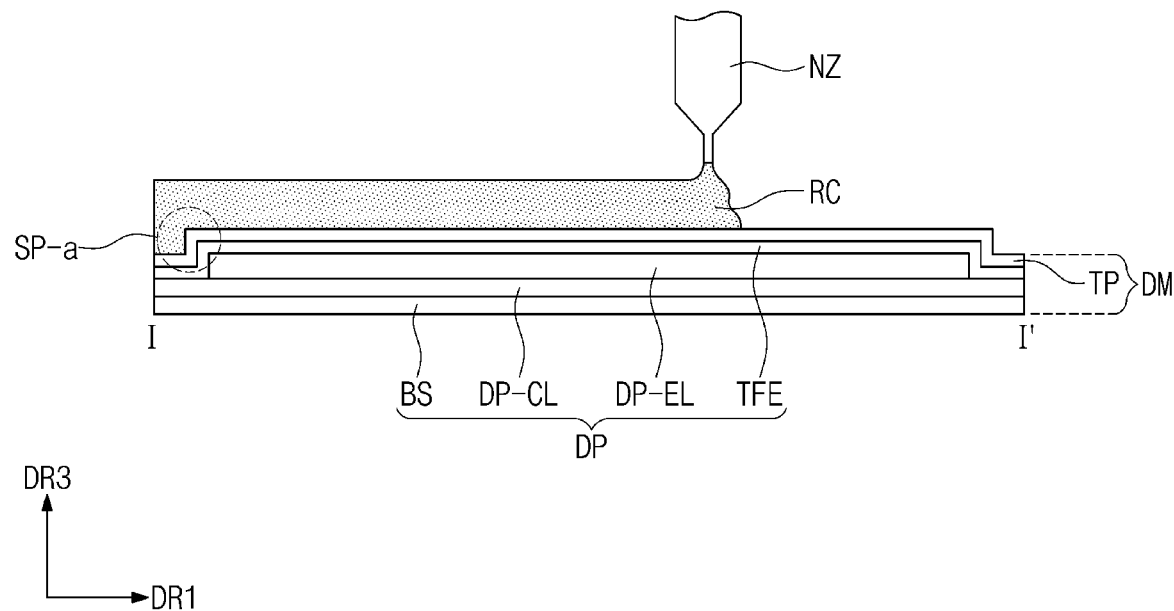
FIG. 5A is a view illustrating a method for manufacturing a display device according to an embodiment.
Figure 5B:
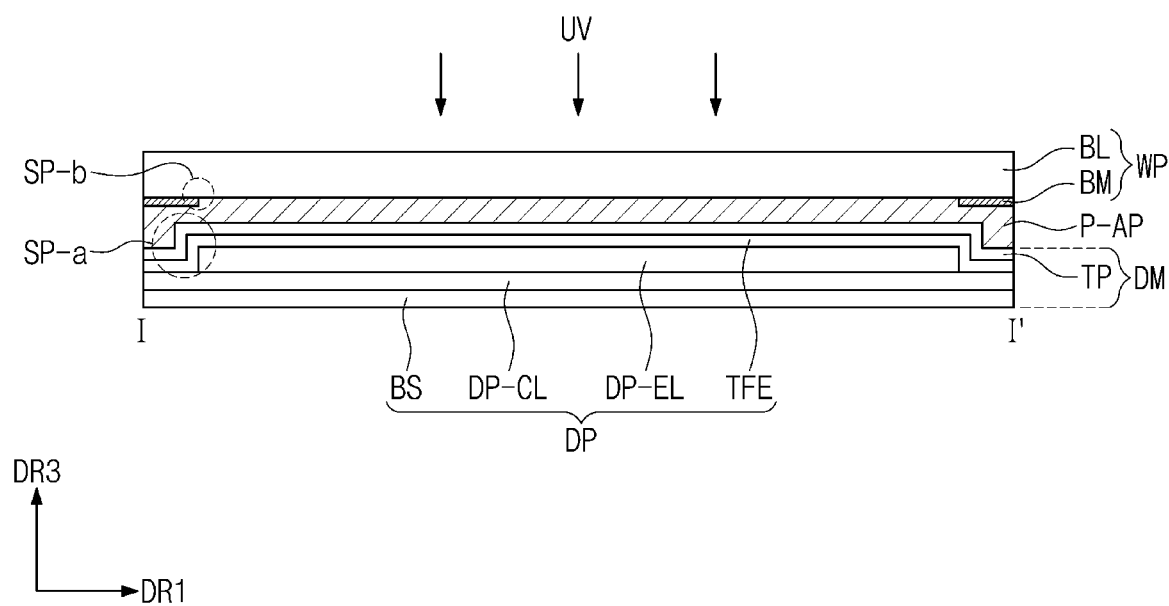
FIG. 5B is a view illustrating a method for manufacturing a display device according to an embodiment.

FIGS. 5A and 5B schematically illustrate forming an adhesive layer AP from a resin composition RC. FIG. 5A illustrates providing the resin composition RC on a display module DM. FIG. 5B illustrates irradiating a preliminary adhesive layer P-AP formed from the resin composition RC with UV light.

The resin composition RC may be provided by a method such as an inkjet printing method or a dispensing coating method. The resin composition RC of an embodiment may be easily discharged from the nozzle NZ by having a viscosity of about 5 cP to about 50 cP at about 25° C., and may be provided to maintain a thin and constant coating thickness. The resin composition may be provided while covering or overlapping the bending of the stepped portion SP-a of the display module DM by having a viscosity of about 5 cP to about 50 cP. For example, the resin composition RC having a viscosity of about 50 cP or less may be provided without an empty space in a bent portion such as the stepped portion SP-a. In addition, the resin composition RC provided through the nozzle NZ may have a viscosity of about 5 cP or more so that the resin composition RC may be coated to a uniform thickness without flowing out of the display module DM.

The window WP may be provided or disposed on the preliminary adhesive layer P-AP provided by coating the resin composition RC to a constant thickness. Ultraviolet light UV for curing the resin composition RC may be provided through the window WP. In case that the window WP is provided on the preliminary adhesive layer P-AP, the stepped portion SP-b may be filled with the resin composition RC without an empty space. For example, since the resin composition RC has a viscosity of about 50 cP or less, the preliminary adhesive layer P-AP may be provided while covering or overlapping the substantially bent shapes in the bent portion such as the stepped portion SP-a between the base layer BL and the printing layer BM.

The preliminary adhesive layer P-AP may be polymerized and cured by the provided ultraviolet light UV to form an adhesive layer AP. The adhesive layer AP (FIG. 7) provided in the display device DD (FIG. 4) may have a storage elastic modulus of about $1.0\times10^3$ Pa to about $1.0\times10^6$ Pa at about 25° C.

Unlike the feature illustrated in FIG. 5B, before the window WP is provided on the preliminary adhesive layer P-AP, the ultraviolet light UV may be provided on the preliminary adhesive layer P-AP to perform the polymerization in the resin composition RC. The irradiation amount of the ultraviolet light UV may be an amount of light to fully cure the resin composition RC. Unlike this, the polymerization of the resin composition RC may be partially performed in the preliminary adhesive layer P-AP state, the window WP may be provided and an unreacted resin composition RC may be further reacted to form an adhesive layer AP.

Figure 6:
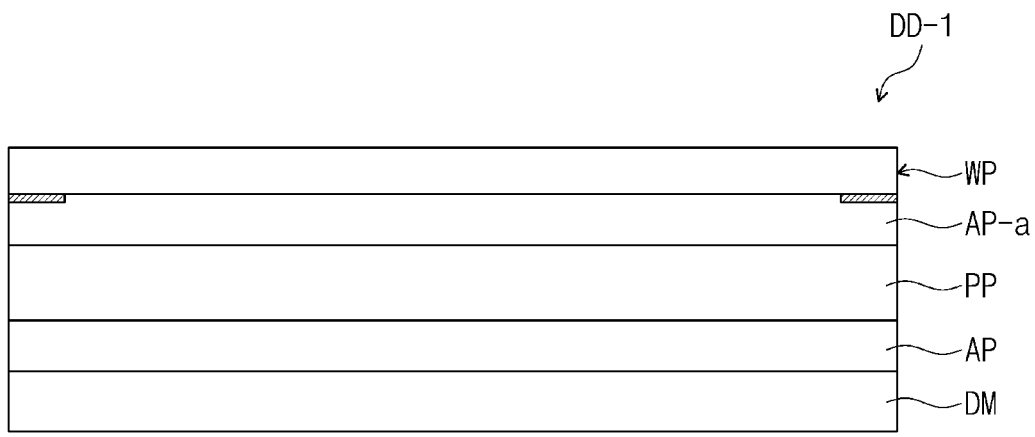
FIG. 6 is a schematic cross-sectional view of a display apparatus according to an embodiment.
Figure 7:
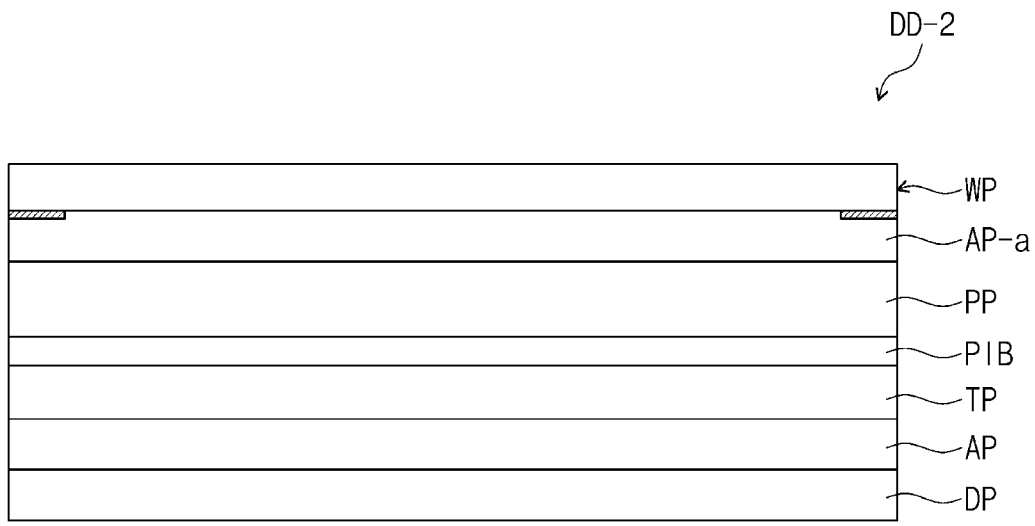
FIG. 7 is a schematic cross-sectional view of a display apparatus according to an embodiment.

FIGS. 6 and 7 are schematic cross-sectional views schematically illustrating display devices according to embodiments. In the description of FIGS. 6 and 7, the duplicated features which have been described with reference to FIGS. 1 to 7 are not described again, but their differences will be described.

Unlike the display device DD in FIG. 4, a display device DD-1 in FIG. 6 further may include a light control layer PP and an optical adhesive layer AP-a. The light control layer PP may be disposed between an adhesive layer AP and a window WP, the optical adhesive layer AP-a may be disposed between the light control layer PP and the window WP. For example, the adhesive layer AP, the light control layer PP, the optical adhesive layer AP-a, and the window WP may be sequentially stacked each other.

The light control layer PP may be disposed on the display panel DP to control reflected light in the display panel DP due to external light. The light control layer PP may include a polarizing layer or a color filter layer.

The optical adhesive layer AP-a may include a polymer derived from the resin composition of an embodiment as the adhesive layer AP may include. The optical adhesive layer AP-a may include a polymer derived from a resin composition including a first (meth)acrylate monomer, a second (meth)acrylate monomer, a second (meth)acrylate monomer, and at least one photoinitiator.

In an embodiment, the optical adhesive layer AP-a may have a storage elastic modulus in a range of about $1.0\times10^3$ Pa to about $1.0\times10^6$ Pa at about 25° C. The optical adhesive layer AP-a exhibiting a storage elastic modulus in a range of about $1.0\times10^3$ Pa to about $1.0\times10^6$ Pa at about 25° C. may keep reliability in case that the display device DD-1 is repeatedly folded and unfolded. The optical adhesive layer AP-a formed from the resin composition of an embodiment may exhibit good adhesion to members such as the window WP.

Referring to FIG. 7, the display device DD-2 may further include an interlayer adhesive layer PIB disposed between the input sensing unit TP and the light control layer PP. The interlayer adhesive layer PIB may be formed of an adhesive material having excellent moisture permeation prevention properties. In the display device DD-2, the adhesive layer AP may be disposed between the display panel DP and the input sensing unit TP, and the optical adhesive layer AP-a may be disposed between the light control layer PP and the window WP. The description of the light control layer PP and the optical adhesive layer AP-a may be the same as those described with reference to FIG. 6.

Hereinafter, with reference to Examples and Comparative Examples, a display device including a resin composition according to an embodiment of the disclosure and an adhesive layer formed from the resin composition will be described in detail. Examples shown below are illustrated only for the understanding of the disclosure, and the scope of the disclosure is not limited thereto.

EXAMPLES

1. Synthesis of First (Meth)Acrylate Monomer

A synthesis method of a first (meth)acrylate monomer will be described by illustrating synthesis methods of PM-1 to PM-4. The synthesis method of the first (meth)acrylate monomer is not limited to synthetic examples below.

(1) Synthesis of PM-1

After degassing and drying a three-neck flask equipped with a cooling tube, a magnetic stirrer, and a nitrogen introduction tube, 50 g of 4-hydroxybutyl acrylate (Osaka Organic Chemical Industry Ltd.), 70 g of triethylamine, and 750 ml of ethyl acetate were added and cooling-stirred for about 1 hour in ice water. Seventy grams of dimethyl chlorophosphate (Tokyo Chemical Industry Co., Ltd.) was added dropwise thereto and reacted for about 1 hour in ice water and for about 4 hours at about 60° C. Precipitated salts were removed by filtration and separation, and purified by silica gel column chromatography to obtain about 40 g of PM-1.

(2) Synthesis of PM-2

About 20 g of PM-2 was obtained by performing synthesis in the same manner as in the synthesis of PM-1, except that 32 g of 10-hydroxydecyl acrylate (SYA-004, Sanyoo Chemical Laboratories Co., Ltd.) was used instead of 4-hydroxybutyl acrylate.

(3) Synthesis of PM-3

About 16 g of PM-3 was obtained by performing synthesis in the same manner as in the synthesis of PM-1, except that 19.6 g of BLEMMER AE-200 (single-terminal-modified monoacrylate of polyethylene glycol having a molecular weight of about 200, Nichiyu Co., Ltd.) was used instead of 4-hydroxybutyl acrylate.

(4) Synthesis of PM-4

About 10 g of PM-4 was obtained by performing synthesis in the same manner as in the synthesis of PM-1, except that 10.5 g of BLEMMER AE-400 (modified monoacrylate of polyethylene glycol having a molecular weight of about 440, Nichiyu Co., Ltd.) was used instead of 4-hydroxybutyl acrylate.

PM-1 to PM-4 are listed in Table 1 below.

TABLE 1

PM-1

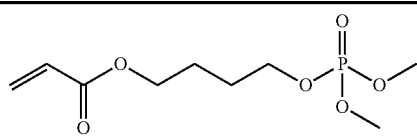

PM-2

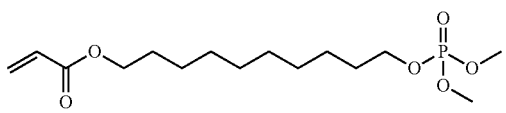 [SMILES: C=CC(=O)OCCCCCCCCCCOP(=O)(OC)OC]

PM-3

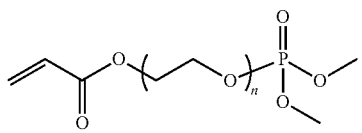

Polyethylene glycol molecular weight: about 200, n: about 2.9

TABLE 1-continued

PM-4

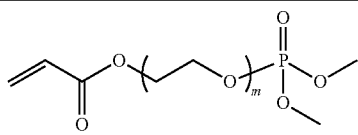

Polyethylene glycol molecular weight: about 440, m: about 8.4

2. Preparation of Resin Composition

Resin compositions of Examples and Comparative Examples were prepared with the compound ratio listed in Tables 2 and 3.

Component A, component B, and component C were provided for a heat-resistant light-shielding container in the weight ratio shown in Table 1, and stirred at room temperature for about 12 hours by using a mix rotor. After confirming that the composition was uniformly stirred, component D was added thereto, and stirred at room temperature for about 3 hours by using a mix rotor. Component D was uniformly mixed to prepare resin compositions of Examples and Comparative Examples.

In the resin compositions of Examples 1 to 5, component A is a first (meth)acrylate monomer containing a phosphate ester group. In the resin compositions of Examples 1 to 4, any one among PM-1 to PM-4 was used as component A, and in the resin composition of Example 5, MR-260 (Daihachi Chemical Industry) was used as component A.

In the resin compositions of Examples 1 to 5, component B is a urethane (meth)acrylate oligomer, and UF-C051 was used. In the resin compositions of Examples 1 to 5, component C is a second (meth)acrylate monomer, and 2-ethylhexyl acrylate 2EHA was used. Component D is a photoinitiator, and in the resin compositions of Examples 1 to 5, Omnirad TPO-H was used.

In the resin compositions of Comparative Examples 1 to 3, light acrylate P-1A(N) containing a phosphate ester group was used as component A, and in the resin composition of Comparative Example 5, PM-1 containing a phosphate ester group was used as component A. In the resin composition of Comparative Example 4, component A was not used.

In the resin compositions of Comparative Examples 1 to 4, the urethane (meth)acrylate oligomer was used as component B, and the resin composition of Comparative Example 5 did not include component B.

In Comparative Examples 1, 4 and 5, 2-ethylhexyl acrylate (2EHA), which is a (meth)acrylate monomer, was used as component C, and in Comparative Examples 2 and 3, light acrylate EC-A, which is a (meth)acrylate monomer, was used as component C.

Component E is an additive and/or a (meth)acrylate monomer, and provided together with components A to C in case that producing the resin composition. In Comparative Example 4, cresyl diphenyl phosphate (CDP), which is an additive containing a phosphate ester group, and 4-hydroxybutyl acrylate (4-HBA), which is a (meth)acrylate monomer containing a hydroxy group, were used as component E. In Comparative Example 5, β-carboxyethyl acrylate (β-CEA), which is a (meth)acrylate monomer containing a carboxyl group, was used as component E.

TABLE 2

| Components | | Example 1 | Example 2 | Example 3 | Example 4 | Example 5 |
|---|---|---|---|---|---|---|
| A | PM-1 | 70 | | | | |
| | PM-2 | | 65 | | | |
| | PM-3 | | | 55 | | |
| | PM-4 | | | | 50 | |
| | MR-260 | | | | | 25 |
| B | UF-C051 | 15 | 15 | 15 | 15 | 15 |
| C | 2EHA | 15 | 20 | 30 | 35 | 60 |
| D | Omnirad TPO-H | 2 | 2 | 2 | 2 | 2 |

TABLE 3

| Components | | Comparative Example 1 | Comparative Example 2 | Comparative Example 3 | Comparative Example 4 | Comparative Example 5 |
|---|---|---|---|---|---|---|
| A | PM-1 | | | | | 70 |
| | Light acrylate P-1A(N) | 5 | 5 | 50 | | |
| B | UF-C051 | 15 | 15 | 15 | 15 | |
| C | 2EHA | 80 | | | 55 | 15 |
| | Light acrylate EC-A | | 80 | 35 | | |
| D | Omnirad TPO-H | 2 | 2 | 2 | 2 | 2 |
| E | CDP | | | | 5 | |
| | β-CEA | | | | | 15 |
| | 4-HBA | | | | 30 | |

(Data on substances used as component A)

MR-260: Diphenyl-2-Methacryloyloxyethyl-Phosphate (Daihachi Chemical Industry)

Light acrylate P-1A(N): 2-acryloyloxy ethyl phosphate (KYOEISHA CHEMICAL)

(Data on Substances Used as Component B)
UF-C051: urethane acrylate (KYOEISHA CHEMICAL)

(Data on Substances Used as Component C)
2EHA: 2-ethylhexyl acrylate (Mitsubishi Chemical)
Light acrylate EC-A: ethoxy diethyleneglycol acrylate (KYOEISHA CHEMICAL)

(Data on Substances Used as Component D)
Omnirad TPO-H: 2,4,6-trimethylbenzoyl-diphenyl-phosphine oxide (IGM Resins)

(Data on Substances Used as Component E)
CDP: cresyl diphenyl phosphate (Tokyo Chemical Industry)
β-CEA: β-carboxyethyl acrylate (DAICEL-ALLNEX)
4-HBA: 4-hydroxybutyl acrylate (Osaka Organic Chemical Industry)

3. Evaluation of Physical Properties of Resin Composition and Adhesive Layer Formed from the Resin Composition Tables 4 and 5 below show the evaluation of physical properties of resin compositions having the composition ratio of Tables 2 and 3 and adhesive layers formed from the resin compositions. Tables 4 and 5 show the measurement of the viscosity of the resin compositions and the storage elastic modulus values of the adhesive layers formed from the resin compositions and the evaluation of the compatibility of the resin compositions, the elastic modulus temperature stability, bending reliability, and heat resistance reliability of the adhesive layers. The method for measuring viscosity and storage elastic modulus and the method for evaluating compatibility, elastic modulus temperature stability, bending reliability, and heat resistance reliability are as follows.

[Compatibility Evaluation Method]

The compatibility of the resin compositions was evaluated with the naked eye. In Tables 4 and 5, compatibility "O" indicates that the resin composition is uniformly blended, compatibility "Δ" indicates that the resin composition is partially or totally suspended, and compatibility "X" indicates that the resin composition is phase separated.

[Viscosity Measurement Method]

The viscosity of the resin composition is measured according to JIS K 7117-2 method at about 25° C. at a speed of about 10 rpm to about 100 rpm using a viscometer TVE-25L (TOKI SANGYO CO., Ltd.).

[Storage Elastic Modulus Measurement Method]

The storage elastic modulus was measured according to JIS K 7244-6 method using a rheometer MCR 302 (Anton-Paar). The measuring was performed through the Torsional Shear method, and the resin compositions of Examples and Comparative Examples were irradiated with about 1,000 mJ/cm$^2$ of ultraviolet light having a wavelength of about 365 nm and photocured, and the storage elastic modulus was measured. The thicknesses of the resin compositions before being cured were about 500 μm. The storage elastic modulus was measured under the conditions of a frequency of about 1 Hz and temperatures of about 25° C., about −20° C., and about 60° C. The heating rate was about 5° C./min.

[Elastic Modulus Temperature Stability Evaluation Method]

The storage elastic modulus measured at about −20° C. and about 60° C. was substituted into Equation 1 below, and the temperature stability was evaluated.

$$S_T = G'20/G'60 \quad \text{[Equation 1]}$$

In Equation 1, G'20 is a storage elastic modulus value measured at about −20° C., and G'60 is a storage elastic modulus value measured at about 60° C. In Tables 4 and 5, "O" refers to a case where $S_T$ values are 1 to less than 15, "Δ" refers to a case where $S_T$ values are 15 to less than 30, and "X" refers to a case where $S_T$ values are 30 or greater.

[Bending Reliability Evaluation Method]

Under the condition of about 23° C. and about 50% relative humidity (RH), the resin compositions of Examples and Comparative Examples were applied to one surface or a surface of a polyethylene terephthalate film (thickness: about 100 μm), and additionally, the provided resin compositions were covered with or overlapped by a separate polyethylene terephthalate film (thickness: about 100 μm), and the photoreaction was performed by irradiating the resin compositions with about 1,000 mJ/cm$^2$ of ultraviolet light. The thickness of the adhesive layer formed by performing photoreaction was adjusted to about 10 μm. Thereafter, the adhesive layer prepared the condition of about 23° C. and about 50% RH was left for about 24 hours. The laminate composed of the PET film/adhesive layer/PET film thus obtained was cut into about 50 mm in width and about 200 mm in length, and this was used as a sample.

The obtained sample was repeatedly bent under the following conditions using a durability tester (Tension-Free U-shaped extension tester, Yuasa System Equipment Co. Ltd). Thereafter, whether any gap or peeling was at the interface between the adhesive layer and the adherend (PET film) and whether an adhesive was leaked out from the adhesive layer of the laminate was observed with the naked eyes to evaluate the reliability. The repeated bending experiment was performed by observing the state after bending about 30,000 times with a bending diameter of about 3 mm at about 23° C.

In Tables 4 and 5, "O" indicates no gap, peeling, and leakage of the adhesive, "Δ" indicates that some gap of the adhesive layer and leakage of the adhesive were observed, and "X" indicates that the adherend was separated.

[Heat Resistance Reliability Evaluation Method]

The laminate sample which was prepared in the same manner as in the bending reliability evaluation method was heated in a 70° C. dry oven for about 24 hours. Thereafter, whether the laminate was separated or not was observed with the naked eyes. In Tables 4 and 5, "O," "Δ," and "X" are represented with the same criteria as the bending reliability evaluation method.

TABLE 4

| Item | Example 1 | Example 2 | Example 3 | Example 4 | Example 5 |
|---|---|---|---|---|---|
| Compatibility | O | O | O | O | O |
| Viscosity (cP) | 37 | 33 | 40 | 42 | 27 |
| Storage elastic modulus (Pa, 25° C.) | $1.5 \times 10^5$ | $2.5 \times 10^5$ | $4.5 \times 10^5$ | $7.2 \times 10^5$ | $8.5 \times 10^5$ |
| Storage elastic modulus (Pa, −20° C.) | $5.1 \times 10^5$ | $6.9 \times 10^5$ | $5.0 \times 10^5$ | $7.5 \times 10^5$ | $9.3 \times 10^5$ |
| Storage elastic modulus (Pa, 60° C.) | $6.2 \times 10^4$ | $5.3 \times 10^4$ | $3.8 \times 10^5$ | $4.9 \times 10^5$ | $1.4 \times 10^5$ |
| Bending reliability | O | O | O | O | O |
| Elastic modulus temperature stability | O | O | O | O | O |
| Heat resistance reliability | O | O | O | O | O |

In the resin composition of Comparative Example 1, phase separation was observed in the compatibility evaluation, and thus other items of the viscosity, the storage elastic modulus, for example, were not evaluated.

TABLE 5

| Item | Comparative Example 1 | Comparative Example 2 | Comparative Example 3 | Comparative Example 4 | Comparative Example 5 |
|---|---|---|---|---|---|
| Compatibility | X | O | O | O | O |
| Viscosity (cP) | — | 49 | 150 | 30 | 38 |
| Storage elastic modulus (Pa, 25° C.) | — | $8.5 \times 10^4$ | $3.0 \times 10^7$ | $6.2 \times 10^4$ | $1.2 \times 10^7$ |
| Storage elastic modulus (Pa, −20° C.) | — | $1.1 \times 10^5$ | $3.7 \times 10^7$ | $2.9 \times 10^5$ | $3.0 \times 10^7$ |
| Storage elastic modulus (Pa, 60° C.) | — | $3.2 \times 10^3$ | $2.8 \times 10^7$ | $1.7 \times 10^4$ | $5.9 \times 10^5$ |
| Bending reliability | — | X | X | O | X |
| Elastic modulus temperature stability | — | X | O | Δ | X |
| Heat resistance reliability | — | X | O | X | O |

Referring to Tables 4 and 5, it may be seen that Comparative Examples 2 to 5 and Examples 1 to 5 have excellent compatibility of the resin compositions. It may be seen that Examples 1 to 5 have excellent bending reliability, elastic modulus temperature stability, and heat resistance reliability of the adhesive layers formed from the resin compositions.

In Examples 1 to 5, it may be seen that the viscosities of the resin compositions are about 25 cP to about 40 cP at about 25° C., and the resin compositions may be provided by an inkjet printing method or a dispensing coating method. In Examples 1 to 5, it may be seen that adhesive layers formed from the resin compositions have storage elastic moduli of about $1.5 \times 10^5$ Pa to about $8.5 \times 10^5$ Pa at about 25° C. In Examples 1 to 5, it may be seen that elastic modulus temperature stabilities of the adhesive layers formed from the resin compositions are 1 to less than 15. For example, it may be seen that the storage elastic modulus value at about −20° C. is about 1 to about 15 (exclusive of 15) times greater than the storage elastic modulus value at about 60° C.

In Examples 1 to 5, the resin composition includes a first (meth)acrylate monomer containing a phosphate ester group and a urethane (meth)acrylate oligomer. The phosphate ester group contained in the first (meth)acrylate monomer exhibits non-acidity. In Examples 1 to 5, the content of the first (meth)acrylate monomer in the resin composition is about 1.6 to about 4.7 times greater than the content of the urethane (meth)acrylate oligomer. Accordingly, in case that the display device including the adhesive layer formed from the resin composition of an embodiment are repeatedly folded and unfolded, the stability may be maintained.

In Comparative Example 1, in case that preparing a resin composition, light acrylate P-1A(N) containing a phosphate ester group was used, and the phosphate ester group exhibits acidity. It is believed that 2-ethylhexyl acrylate, which is an alkyl acrylate having a small polarity, is not well mixed with light acrylate P-1A(N), and thus in Comparative Example 1, the phase separation of the resin composition was observed.

In Comparative Example 2, in case that preparing a resin composition, the same light acrylate P-1A(N) as in Comparative Example was used, and light acrylate EC-A was used instead of 2-ethylhexyl acrylate. In Comparative Example 2, the viscosity of the resin composition and the storage elastic modulus of the adhesive layer formed from the resin composition are excellent, but it may be seen that the adhesive layer was separated through the bending reliability and heat resistance reliability. In Comparative Example 2, the elastic modulus temperature stability of the adhesive layer is about 30 or greater, and it may be seen that the change in the storage elastic modulus depending on temperature is large. In case that the storage elastic modulus value measured at about −20° C. is at least 15 times greater than the storage elastic modulus value measured at about 60° C., the change in the storage elastic modulus of the adhesive layer at a low temperature and a high temperature is large. The adhesive layer having a large change in the storage elastic modulus at a low temperature and a high temperature may reduce the reliability of the display device.

It is believed that in Comparative Example 3, in case that preparing a resin composition, light acrylate P-1A(N) is used more than in Comparative Examples 1 and 2, and thus the elastic modulus temperature stability of the adhesive layer formed from the resin composition is less than 15. However, compared to each of the adhesive layers formed from the resin compositions of Examples 1 to 5, Comparative Example 2, Comparative Example 4, and Comparative Example 5, the adhesive layer formed from the resin composition of Comparative Example 3 exhibited significantly large storage elastic modulus at about −20° C. and about 60° C., and in case that evaluating the bending reliability, the PET film as an adherend was peeled off. It may be observed that in Comparative Example 3, the resin composition exhibits a viscosity of 150 cP, and thus, may not be suitable to be provided by an inkjet printing method or a dispensing coating method.

In Comparative Example 4, in case that preparing a resin composition, additives and a (meth)acrylate monomer containing a hydroxy group instead of a phosphate ester group were used, and cresyl diphenyl phosphate, which is an additive, contains a phosphate ester group. It is believed that in Comparative Example 4, as the monomer containing a phosphate ester group was used, the adhesive layer formed from the resin composition exhibited excellent storage elastic modulus and bending reliability. However, it is believed that in Comparative Example 4, in case that preparing a resin composition, the monomer containing a phosphate ester group was used in a low content of about 5%, and thus the adherend was peeled off in the heat resistance reliability evaluation. It is believed that in Comparative Example 4, in case that preparing a resin composition, the first (meth)acrylate monomer containing a phosphate ester group was not used, and thus the elastic modulus temperature stability of the adhesive layer formed from the resin composition is about 15 or greater.

It may be seen that in Comparative Example 5, β-carboxyethyl acrylate, which is a (meth)acrylate monomer containing a carboxyl group, was used instead of the urethane (meth)acrylate oligomer, and the storage elastic modulus at about 25° C. is $1.2 \times 10^7$ Pa, which is very large. Accordingly, it may be seen that in Comparative Example 5, the adherend was separated in the bending reliability evaluation of the adhesive layer formed from the resin composition, and the elastic modulus temperature stability is about 30 or greater. It is believed that in Comparative Example 5, since β-carboxyethyl acrylate used in the preparation of a resin composition contained a carboxyl group having a large polarity, the interaction between molecules was strong, and thus the adherend was peeled off from the adhesive layer and the change in elastic modulus depending on temperature was large.

The resin composition of an embodiment may include a first (meth)acrylate monomer containing a phosphate ester group, a urethane (meth)acrylate oligomer, a second (meth)acrylate monomer, and at least one a photoinitiator. In the resin composition, the content of the first (meth)acrylate monomer may be about 1.6 to about 4.7 times greater than the content of the urethane (meth)acrylate oligomer. Accordingly, the resin composition of an embodiment may exhibit a low viscosity before being cured and a favorable change in storage elastic modulus depending on temperature after being cured.

The display device of an embodiment may include the adhesive layer disposed between the display panel and the window, and the adhesive layer may be formed from the resin composition of an embodiment. The adhesive layer formed from the resin composition of an embodiment has a storage elastic modulus of about $1.0 \times 10^3$ Pa to about $1.0 \times 10^6$ Pa at about 25° C. and may contribute to keeping reliability of the display device in case that the display device is repeatedly folded and unfolded.

The resin composition according to an embodiment of the disclosure may have a low viscosity characteristic and exhibit excellent applicability on various forms of substrates.

The display device according to an embodiment of the disclosure may include an adhesive layer having a low elastic modulus and high adhesion, and may thus exhibit excellent reliability in various operations.

Although the disclosure has been described with reference to an embodiment of the disclosure, it will be understood that the disclosure should not be limited to these embodiments but various changes and modifications can be made by those skilled in the art without departing from the spirit and scope of the disclosure.

Accordingly, the technical scope of the disclosure is not intended to be limited to the contents set forth in the detailed description of the specification, but is intended to be defined by all equivalents and the appended claims.

What is claimed is:

1. A resin composition comprising:
   a first (meth)acrylate monomer represented by Formula 1;
   a second (meth)acrylate monomer containing a substituted or unsubstituted oxy group or a substituted or unsubstituted divalent alkyl group having 4 to 18 carbon atoms;
   a urethane (meth)acrylate oligomer; and
   at least one photoinitiator,
   wherein a content of the first (meth)acrylate monomer is about 1.6 to about 4.7 times greater than a content of the urethane (meth)acrylate oligomer,

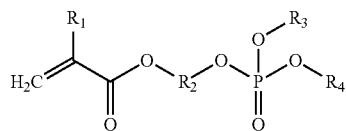

[Formula 1]

wherein, in Formula 1,
$R_1$ is a hydrogen atom, or a substituted or unsubstituted alkyl group having 1 to 6 carbon atoms,
$R_2$ is a substituted or unsubstituted divalent alkyl group having 1 to 10 carbon atoms, a substituted or unsubstituted divalent alkenyl group having 2 to 10 carbon atoms, a divalent alkenyl group including an ether bond and having 2 to 10 carbon atoms, or a substituted or unsubstituted divalent alkynyl group having 2 to 10 carbon atoms, and
$R_3$ and $R_4$ are each independently a substituted or unsubstituted alkyl group having 1 to 10 carbon atoms, a substituted or unsubstituted alkenyl group having 2 to 10 carbon atoms, a substituted or unsubstituted alkynyl group having 2 to 10 carbon atoms, or a substituted or unsubstituted aryl group having 6 to 20 ring-forming carbon atoms.

2. The resin composition of claim 1, wherein the resin composition has a viscosity in a range of about 5 cP to about 50 cP at about 25° C. as measured according to JIS K 7117-2 method.

3. The resin composition of claim 1, wherein the content of the first (meth)acrylate monomer is in a range of about 25 wt % to about 70 wt % with respect to a total content of the resin composition.

4. The resin composition of claim 1, wherein the content of the urethane (meth)acrylate oligomer is in a range of about 5 wt % to about 30 wt % with respect to a total content of the resin composition.

5. The resin composition of claim 1, wherein
a content of the second (meth)acrylate monomer is in a range of about 15 wt % to about 60 wt % with respect to a total content of the resin composition, and
a content of the at least one photoinitiator is in a range of about 0.5 wt % to about 5 wt % with respect to the total content of the resin composition.

6. The resin composition of claim 1, wherein the resin composition has a storage elastic modulus at about −20° C. in a range of about 1 to about 10 times greater than a storage elastic modulus at about 60° C. after being UV cured.

7. The resin composition of claim 1, wherein the resin composition has a storage elastic modulus in a range of about $1.0 \times 10^3$ Pa to about $1.0 \times 10^6$ Pa at about 25° C. after being UV cured.

8. The resin composition of claim 1, wherein the second (meth)acrylate monomer comprises at least one of n-butyl (meth)acrylate, n-hexyl (meth)acrylate, n-octyl (meth)acrylate, 2-ethylhexyl acrylate, isodecyl (meth)acrylate, ethoxy diethyleneglycol acrylate, or 2-ethylhexyl-diglycol acrylate.

9. A display device comprising:
   a display module including a display panel;
   a window disposed on the display panel; and
   an adhesive layer disposed between the display panel and the window,
   wherein the adhesive layer comprises a polymer derived from a resin composition including:
      a first (meth)acrylate monomer represented by Formula 1;
      a second (meth)acrylate monomer containing a substituted or unsubstituted oxy group or a substituted or unsubstituted divalent alkyl group having 4 to 18 carbon atoms;
      a urethane (meth)acrylate oligomer; and
      at least one photoinitiator; and
   a content of the first (meth)acrylate monomer is about 1.6 to about 4.7 times greater than a content of the urethane (meth)acrylate oligomer,

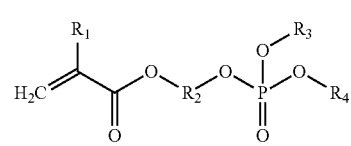

[Formula 1]

wherein, in Formula 1,
$R_1$ is a hydrogen atom or a substituted or unsubstituted alkyl group having 1 to 6 carbon atoms,
$R_2$ is a substituted or unsubstituted divalent alkyl group having 1 to 10 carbon atoms, a substituted or unsubstituted divalent alkenyl group having 2 to 10 carbon atoms, a divalent alkenyl group including an ether bond and having 2 to 10 carbon atoms, or a substituted or unsubstituted divalent alkynyl group having 2 to 10 carbon atoms, and
$R_3$ and $R_4$ are each independently a substituted or unsubstituted alkyl group having 1 to 10 carbon atoms, a substituted or unsubstituted alkenyl group having 2 to 10 carbon atoms, a substituted or unsubstituted alkynyl group having 2 to 10 carbon atoms, or a substituted or unsubstituted aryl group having 6 to 20 ring-forming carbon atoms.

10. The display device of claim 9, wherein
the resin composition is directly disposed on a surface of the window or a surface of the display module, and the adhesive layer is formed by UV curing the resin composition.

11. The display device of claim 9, wherein the content of the first (meth)acrylate monomer is in a range of about 25 wt % to about 70 wt %, and the content of the urethane (meth)acrylate oligomer is in a range of about 5 wt % to about 30 wt % with respect to a total content of the resin composition.

12. The display device of claim 9, wherein a content of the second (meth)acrylate monomer is in a range of about 15 wt % to about 60 wt %, and a content of the at least one photoinitiator is in a range of about 0.5 wt % to about 5 wt % with respect to a total content of the resin composition.

13. The display device of claim 9, wherein the adhesive layer has a thickness in a range of about 10 μm to about 200 μm.

14. The display device of claim 9, wherein the adhesive layer has a storage elastic modulus at about −20° C. in a range of about 1 to about 10 times greater than a storage elastic modulus at about 60° C.

15. The display device of claim 9, wherein the adhesive layer has a storage elastic modulus in a range of about $1.0 \times 10^3$ Pa to about $1.0 \times 10^6$ Pa at about 25° C.

16. The display device of claim 9, further comprising:
at least one folding area,
wherein the at least one folding area has a radius of curvature of about 5 mm or less.

17. The display device of claim 9, further comprising:
an input sensing unit disposed on the display panel,
wherein the adhesive layer is disposed between the display panel and the input sensing unit or disposed between the input sensing unit and the window.

18. The display device of claim 17, wherein
the display panel comprises:
a display element layer; and
an encapsulation layer disposed on the display element layer, and
the input sensing unit is directly disposed on the encapsulation layer, and the adhesive layer is disposed on the input sensing unit.

19. The display device of claim 9, further comprising:
a light control layer disposed between the adhesive layer and the window; and
an optical adhesive layer disposed between the light control layer and the window,
wherein the optical adhesive layer comprises a polymer derived from the resin composition.

20. The display device of claim 19, wherein the optical adhesive layer has a storage elastic modulus in a range of about $1.0 \times 10^3$ Pa to about $1.0 \times 10^6$ Pa at about 25° C.

* * * * *